United States Patent
Lee et al.

(10) Patent No.: US 9,235,129 B2
(45) Date of Patent: Jan. 12, 2016

(54) COMPOSITION FOR PHOTORESIST DEVELOPMENT AND METHOD OF DEVELOPING PHOTORESIST USING THE SAME

(71) Applicant: SAMSUNG ELECTRO-MECHANICS CO., LTD., Suwon-si (KR)

(72) Inventors: Chang Bo Lee, Suwon-si (KR); Chang Sup Ryu, Suwon-si (KR); Dae Jo Hong, Suwon-si (KR); Hyo Seung Nam, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/172,283

(22) Filed: Feb. 4, 2014

(65) Prior Publication Data

US 2014/0370446 A1 Dec. 18, 2014

(30) Foreign Application Priority Data

Jun. 13, 2013 (KR) ........................ 10-2013-0067922

(51) Int. Cl.
*G03F 7/32* (2006.01)
(52) U.S. Cl.
CPC ........................................ *G03F 7/32* (2013.01)
(58) Field of Classification Search
CPC .................................. G03F 7/322; G03F 7/32
See application file for complete search history.

(56) References Cited

U.S. PATENT DOCUMENTS 5,589,250 A * 12/1996 Asai et al. ..................... 428/209
2004/0253540 A1 * 12/2004 Yoshida et al. ............ 430/281.1

FOREIGN PATENT DOCUMENTS

| JP | 9-311458 | 12/1997 |
| JP | 2004-252485 | 9/2004 |
| JP | 2011-192692 | 9/2011 |
| JP | 2013-520458 | 6/2013 |
| KR | 1990-0002227 | 4/1990 |
| WO | 2011/104127 | 9/2011 |

OTHER PUBLICATIONS

Office Action dated Dec. 9, 2014 for Japanese Patent Application No. 2014-026104 and its English summary provided by Applicant's foreign counsel.
Office action dated Feb. 18, 2014 from corresponding Korean Patent Application No. 10-2013-0067922 and its English summary provided by the applicants.

* cited by examiner

*Primary Examiner* — Brittany Raymond
(74) *Attorney, Agent, or Firm* — NSIP Law (57) ABSTRACT

The present invention provides a composition for developing a photoresist containing a carboxyl group (—COOH) and a method of developing a photoresist using the composition. The composition includes: a first solution including a salt containing a monovalent cationic component; and a second solution including a salt containing a bivalent cationic component. The composition for photoresist development is advantageous in that the developing depth of a photoresist can be controlled, and the developed surface of a photoresist is flat, thereby enabling the photoresist to be developed to realize precise three-dimensional packaging.

16 Claims, 6 Drawing Sheets

COMPOSITION FOR PHOTORESIST DEVELOPMENT AND METHOD OF DEVELOPING PHOTORESIST USING THE SAME

CROSS REFERENCE TO RELATED APPLICATION

This application claims the benefit of Korean Patent Application No. 10-2013-0067922, filed on Jun. 13, 2013, entitled "Composition for photoresist development and developing method using the same," which is hereby incorporated by reference in its entirety into this application.

BACKGROUND OF THE INVENTION

1. Technical Field

The present invention relates to a composition for photoresist development and a method of developing a photoresist using the same.

2. Description of the Related Art

When a semiconductor or the like is mounted on a printed circuit board, a process of developing a photoresist layer is followed. Such a developing process means a process of removing a photoresist layer. The photoresist layer serves as an insulation layer or protective layer of a printed circuit board. A solder resist is included in a photoresist. Such a photoresist developing process is known as a solder resist opening process. Such a solder resist opening process is necessarily required in order to secure a passage for electrical connection between a chip mounted on a printed circuit board and a wiring layer formed on the printed circuit board.

As a conventional photoresist opening method, buffing, plasma etching, chemical etching or the like is known. Buffing or plasma etching is a method of forming a photoresist layer having a thickness equal to or less than the height of a copper pattern by curing a photoresist and then physically or chemicophysically treating the cured photoresist. Chemical etching is a method of forming a photoresist layer having a thickness equal to or less than the height of a copper pattern by treating the unexposed area (uncured area) of a photoresist with a chemical. The chemical used in a conventional developing method is an aqueous alkali solution. Meanwhile, most conventional developing solutions are prepared using a salt containing a monovalent cation. Particularly, as disclosed in the following Patent document 1, an aqueous solution containing 1 wt % of sodium carbonate ($Na_2CO_3$) is used as a developing solution.

Meanwhile, recently, three-dimensional packaging technologies have attracted considerable attention in relation to the provision of various circuit patterns and mounting conditions. In order to use such three-dimensional technologies, a photoresist must be provided with predetermined bumps, and, in order to secure such bumps, precisely-controllable developing technologies are required during a photoresist developing process. For this purpose, conventionally, a partial curing process has been used. However, this partial curing process is problematic in that it is difficult to secure precise bumps and control the developing depth of a photoresist because of the characteristics of developing chemicals used in this process.

As a conventional technology for controlling the developing depth of a photoresist, a method of diluting a developing chemical with water, a method of controlling developing time, or the like, has been used. Here, the developing chemical is an aqueous solution containing a salt having a monovalent cation. The development principle of a conventional developing solution including an aqueous solution containing a salt having a monovalent cation is realized by a process in which sodium (Na) included in the developing solution reacts with a carboxyl group (—COOH) included in a photoresist to obtain —COONa, thus saponifying the photoresist to melt the photoresist. However, due to the characteristics of —COONa, which is hydrophilic, —COONa is rapidly detached from the photoresist by water ($H_2O$) existing therearound, and thus it becomes difficult to control the developing speed of a photoresist. Meanwhile, even when the developing depth of a photoresist is controlled to some degree by diluting a convention developing solution, there remains a problem in that the developed surface of a photoresist is very irregular, and thus a spatial environment for precise three-dimensional packaging cannot be provided.

Patent document 1: Japanese Unexamined Patent Application Publication No. 2011-192692

SUMMARY OF THE INVENTION

Thus, the present inventors found that the above-mentioned problem could be solved by adding an aqueous solution including a salt containing a bivalent cationic metal to a conventional developer including a salt containing a monovalent cationic metal. Based on this finding, the present invention was completed.

Accordingly, the present invention has been devised to solve the above-mentioned problems, and an object of the present invention is to provide a composition for photoresist development, including: a first solution including a salt containing a monovalent cationic component; and a second solution including a salt containing a bivalent cationic component.

Another object of the present invention is to provide a method of developing a photoresist using the composition for photoresist development.

In order to accomplish the above objects, a first aspect of the present invention provides a developer composition, including: a metal salt solution; and a dissolution inhibitor.

In the developer composition, the metal salt solution may be a metal salt solution containing a monovalent cation.

Further, the dissolution inhibitor may be a metal salt solution containing a bivalent cation.

Further, each of the metal salt solution and the dissolution inhibitor may be an aqueous solution.

Further, the developer may be a photoresist developer

Further, the photoresist may have a carboxyl group (—COOH).

Further, the photoresist may be a solder resist.

Further, the metal salt containing a monovalent cation may be at least one selected from the group consisting of alkali metal silicate, alkali metal hydroxide, alkali metal phosphate, and alkali metal carbonate.

Further, the metal salt solution containing a bivalent cation is at least one selected from the group consisting of bivalent cationic metal chloride, bivalent cationic metal chlorate, bivalent cationic metal nitride, bivalent cationic metal nitrate, bivalent cationic metal sulfide, bivalent cationic metal sulfate, bivalent cationic metal carbide, bivalent cationic metal carbonate, bivalent cationic metal hydride, and bivalent cationic metal hydroxide.

Further, the bivalent cation may be at least one selected from the group consisting of $Mg^{2+}$, $Ca^{2+}$, and $Sr^{2+}$.

Further, the metal salt containing a monovalent cation may be included in an amount of 1 to 300 g per 1 L of pure water ($H_2O$).

Further, the developer composition may further include an acid.

Further, the acid may be at least one selected from the group consisting of hydrochloric acid, sulfuric acid, and nitric acid.

Further, the developer composition may include 60 to 99.99 vol % of the metal salt solution and 0.01 to 40 vol % of the dissolution inhibitor.

A second aspect of the present invention provides a method of developing a photoresist, including the steps of: forming a photoresist layer on a surface of a circuit substrate having a conductive pattern; disposing an exposure mask having a predetermined pattern over the photoresist layer; applying ultraviolet onto the exposure mask to cure the photoresist layer; and removing the photoresist layer using the developer composition to develop the photoresist layer.

In the method, the step of developing the photoresist may be conducted until the conductive pattern is exposed.

Further, the step of developing the photoresist may be conducted until only the upper portion of the conductive pattern is partially exposed.

Further, the method may further include the step of post-curing the photoresist layer after the step of developing the photoresist layer.

Further, in the step of curing the photoresist layer, the photoresist layer may be partially cured using an exposure mask having an ultraviolet transmitting portion and an ultraviolet partially-transmitting portion.

BRIEF DESCRIPTION OF THE DRAWINGS

The above and other objects, features and advantages of the present invention will be more clearly understood from the following detailed description taken in conjunction with the accompanying drawings, in which.

REFERENCE NUMERALS

10: copper pattern
20: substrate
30: photoresist
40: exposure mask
41: ultraviolet transmitting portion
42: ultraviolet blocking portion, ultraviolet partial transmitting portion
50: ultraviolet radiation
60: developer treatment

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second." "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 1:
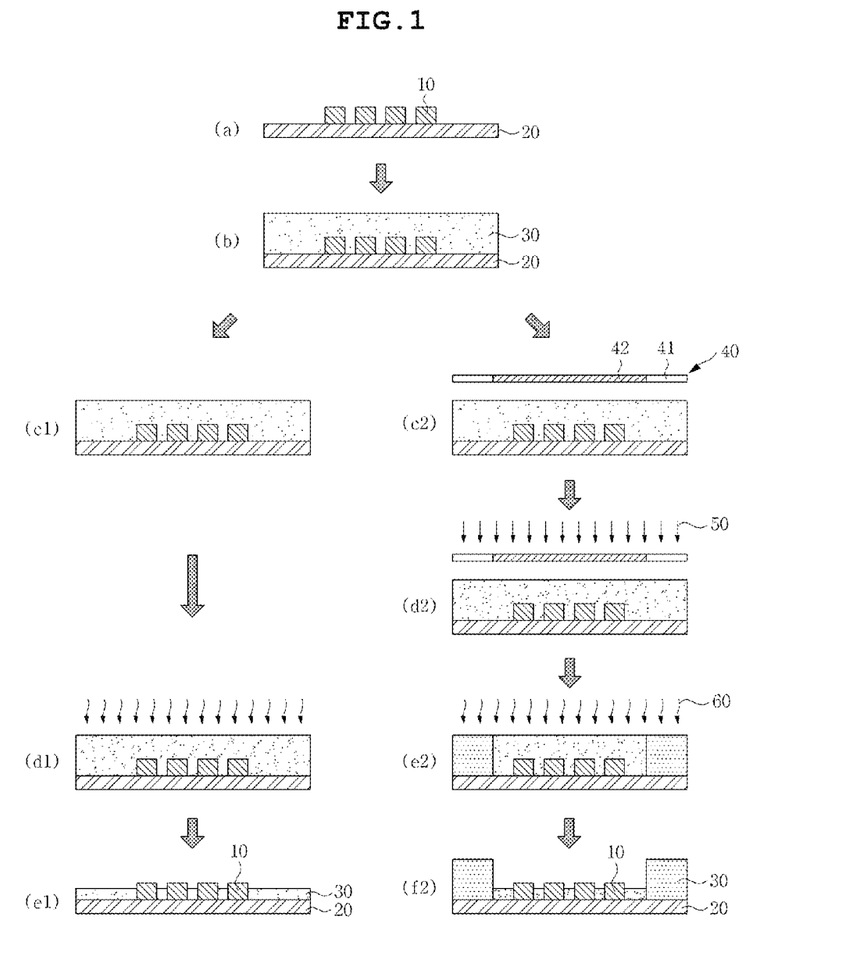
FIG. 1 is a schematic view showing a process of developing a photoresist using a composition for photoresist development according to the present invention.

FIG. 1 is a schematic view showing a process of developing a photoresist using a composition for photoresist development according to the present invention. Meanwhile, it will be understood that the term "photoresist" used in the present invention includes a solder resist. Hereinafter, a process of developing a photoresist will be described with reference to FIG. 1. First, a photoresist layer 30 is formed on a substrate on which a predetermined copper pattern 10 is formed. The photoresist layer 30 is formed of a photocurable composition, and includes a carboxyl group (—COOH). It is required to remove the photoresist layer 20 in order to form an electrical flow passage between the copper pattern 10 formed on the substrate 20 and a chip mounted on the substrate 20. Such a process is referred to as a photoresist opening process or a solder resist opening process. Such a photoresist opening process is generally performed by buffing, plasma etching, thin film formation or the like. However, buffing or plasma etching is problematic in that a possibility of producing defectives is high because a process is complicated and physical inertia is used. Therefore, a method of removing a part of photoresist by a process of developing a photoresist using a developer is most widely used.

However, since the developer used in such a developing process uses a monovalent cation, a saponification reaction of a monovalent cation with a carboxyl group (—COOH) of a photoresist layer rapidly takes place, and thus it is difficult to control the developing depth of the photoresist layer. Therefore, in the present invention, there is proposed a method of mixing an additive containing a bivalent cation with a conventional developing chemical to prepare a composition for photoresist development. The composition prepared by this method includes: to a first solution including a salt containing a monovalent cationic component; and a second solution including a salt containing a bivalent cationic component. Here, the first solution corresponds to a generally-used conventional developing chemical, and the second solution corresponds to the composition for photoresist improvement according to the present invention. Meanwhile, each of the first and second solutions is prepared in the form of an aqueous solution.

The basic concept of the present invention is that an additive containing a bivalent cationic component is used as a means for uniformly developing and removing a photoresist to a predetermined depth to secure a flat developed surface of the photoresist.

The action mechanism of such a bivalent cation can be explained by convection and diffusion.

First, in a conventional photoresist developing process, various chemical reactions take place in combination with each other. Among these chemical reactions, a representative chemical reaction is represented by Chemical Reaction Formula 1 below:

$$2(R\text{—}COOH) + Na_2CO_3 \rightarrow 2(R\text{—}COONa) + H_2O + CO_2 \quad \text{[Chemical Reaction Formula 1]}$$

Referring to Chemical Reaction Formula 1 above, sodium carbonate ($Na_2CO_3$) generally included in a conventional developing solution reacts with a carboxyl group (—COON) included in a photoresist to form R—COONa. In order to cause such a reaction, ions, such as $Na^+$, $H^+$ and the like, move into a photoresist medium. The movement of ions is due to the difference in concentration thereof, and such a mechanism can be explained by diffusion. The R—COONa formed by the reaction has water solubility, and the photoresist converted into R—COONa by water existing in the developing solution is detached. Generally, since such a developing process is carried out in a water tank or a spray chamber, the photoresist is dissolved by external force such as adjacent fluid flow or the like rather than only concentration difference, and such a movement mechanism can be explained by convection. For reference, the reaction of R—COONa to be dissolved in water is referred to as a saponification reaction.

Meanwhile, it is considered that the process of developing a photoresist using a developer according to the present invention proceeds according to Chemical Reaction Formula 2 below:

$$2(R\text{—}COOH) + MgCO_3 \cdot nH_2O \rightarrow (R\text{—}COO)_2Mg + (n+1)H_2O + CO_2 \quad \text{[Chemical Reaction Formula 2]}$$

Referring to Chemical Reaction Formula 2 above, a bivalent cation ($Mg^{2+}$) of magnesium carbonate is diffused into a photoresist, and exists in the form of it being bonded with a carboxyl group (—COOH) of the photoresist. The diffusion of the bivalent cation can be ascertained with reference to FIG. 6. Meanwhile, the bivalent cation boned with the carboxyl group (—COOH), that is, $(R\text{—}COO)_2Mg$ is not dissolved by water included in the developing solution, and continuously remains in the photoresist.

Therefore, when a photoresist is treated with the composition for photoresist development according to the present invention, water-soluble R—COONa and water-insoluble $(R\text{—}COO)_2Mg$ are formed at a suitable ratio, and thus it is possible to control the developing speed of a photoresist.

Such a developing speed control technology can be practically used in various fields. For example, the present invention proposes a process of developing a photoresist layer using a photoresist developing composition containing a bivalent cation. A three dimensional packaging technology of a printed circuit board must be accompanied by a process of forming a bump on a photoresist layer, and particularly, it is required to precisely control the developing depth of a photoresist in order to realize various packaging technologies. When the composition for photoresist development according to the present invention is used, it is possible to control the degree of development of a photoresist to a desired depth, and particularly, this composition can be very efficiently used when only the photoresist located at the upper portion of a copper pattern is precisely removed except for the photoresist located at the lower portion thereof.

The metal salt containing a monovalent cationic component according to the present invention may be selected from the group consisting of alkali metal silicate, alkali metal hydroxide, alkali metal phosphate, and alkali metal carbonate. However, this metal salt is not limited thereto, and other various metal salts containing a monovalent cationic component can also be used in the present invention.

The metal salt containing a bivalent cationic component according to the present invention may be selected from the group consisting of bivalent cationic metal chloride, bivalent cationic metal chlorate, bivalent cationic metal nitride, bivalent cationic metal nitrate, bivalent cationic metal sulfide, bivalent cationic metal sulfate, bivalent cationic metal carbide, bivalent cationic metal carbonate, bivalent cationic metal hydride, and bivalent cationic metal hydroxide. However, this metal salt is not limited thereto, and other various metal salts containing a bivalent cationic component can also be used in the present invention.

The bivalent cationic component may be $Mg^{2+}$, $Ca^{2+}$, $Sr^{2+}$ or the like.

It is preferred that the metal salt containing a monovalent cationic component be included in an amount of 1 to 300 g per 1 L of pure water ($H_2O$). When the amount of the metal salt containing a monovalent cationic component is less than 1 g, there is a problem in that the developing speed of a photoresist becomes very low. When the amount thereof is more than 300 g, there is a problem in that the developing speed of a photoresist cannot be controlled even though the metal salt containing a bivalent cationic component is additionally used.

Meanwhile, the composition for photoresist development according to the present invention may further include an acid. When carbonates or hydroxides are used as bivalent cationic salts, they are not easily dissolved in water. Therefore, the dissolution of carbonates or hydroxides in water can be promoted using hydrochloric acid (HCl), sulfuric acid ($H_2SO_4$), nitric acid ($HNO_3$) or the like. This acid may be added in an amount of 0.1 to 20 vol % based on the amount of the mixed solution of the first solution and the second solution of the present invention.

Meanwhile, in the mixed solution of the first solution including a salt containing a monovalent cationic component and the second solution including a salt containing a bivalent cationic component, the mixing ratio of the first solution may be 60 to 99.99 vol %, and the mixing ratio of the second solution may be 0.01 to 40 vol %. When the mixing ratio of the first solution is less than 60 vol %, there is a problem in that the developing speed of a photoresist excessively becomes low, and when the mixing ration thereof is more than 99.99 vol %, there is a problem in that the developing speed of a photoresist cannot be controlled. Further, when the mixing ratio of the second solution is less than 0.01 vol %, there is a problem in that the developing speed of a photoresist cannot be controlled, and when the mixing ration thereof is more than 40 vol %, there is a problem in that the developing speed of a photoresist excessively becomes low.

Meanwhile, the photoresist 30 applied on the substrate 20 is uncured, and has photocurable characteristics of this photoresist 30 being cured by light such as ultraviolet (UV) or the like. (c1) to (e1) of FIG. 1 show procedures of developing a photoresist without forming a bump. In order to form a bump on a photoresist for the purpose of three dimensional packaging, procedures shown in (c2) to (f2) of FIG. 1 can be carried out. That is, a portion of a photoresist to be removed is covered with an exposure mask 40, and is irradiated with ultraviolet (UV) 50. The exposure mask 40 includes an ultraviolet transmitting portion 41 and an ultraviolet non-transmitting portion 42. The ultraviolet non-transmitting portion may be configured such that ultraviolet partially transmits therethrough.

As such, the ultraviolet-applied portion of a photoresist is cured by light, and the ultraviolet-non-applied portion thereof remains uncured. Meanwhile, in order to remove the uncured portion of a photoresist, a developer composition according to the present invention is used. The developer composition is a mixed solution of an aqueous solution including a salt containing a monovalent cationic component and an aqueous solution including a salt containing a bivalent cationic component. There are various methods of treating a photoresist with this mixed solution. For example, the mixed solution may be sprayed onto a photoresist using a spray nozzle or the like, or a photoresist may be dipped into a water tank filled with the mixed solution. As such, the treatment of a photoresist with the developer composition may be carried out for 30 seconds to 2 minutes, but the treatment time thereof may be adjusted according to the degree of development of a photoresist.

The development control mechanism of the composition of photoresist development of the present invention can be explained by the fact that a development process and a development inhibition process are conducted at the same time. That is, such development control requires the suitable role allotment of the above-mentioned convection and diffusion in terms of material transfer, and requires the suitable mixing ratio of the above-mentioned R—COONa and (R—COO)$_2$Mg in terms of chemical reaction.

After spraying the developer onto the photoresist, and a washing procedure is conducted. The washing procedure is conducted in order to completely remove the photoresist containing R—COONa and (R—COO)$_2$Mg formed by Chemical Reaction Formula 1 above and Chemical Reaction Formula 2 above, respectively.

Meanwhile, it is possible to control the developing depth of a photoresist by adjusting the developing time of a photoresist and the concentrations of the first and second solutions of the present invention. The developing depth control is necessarily required for various types of three dimensional packaging as well as the flattening of the developed surface of a photoresist and the formation of a precise bump.

In the present invention, three dimensional packaging is conducted using partial exposure. Such partial exposure has been used in conventional three dimensional technologies, but is problematic in that it is difficult to form a precise bump because it uses a conventional monovalent cationic developer. However, when partial exposure and development are conducted using the developer composition of the present invention, it is possible to control the precise developing depth of a photoresist as well as to form a precise bump. Meanwhile, the partial exposure used in the present invention includes the difference in degree of development of a photoresist as well as the difference in the exposed portion of a photoresist. That is, the photoresist can be partially exposed by controlling the amount of applied ultraviolet, rather than by completely blocking the radiation of ultraviolet onto the unexposed portion thereof. The partial exposure of a photoresist can be conducted by adjusting the amount of applied ultraviolet, but can also be conducted by forming meshes on the ultraviolet non-transmitting portion 42 of an exposure mask and then controlling the amount of ultraviolet transmitting through the meshes. It is preferred that the exposure of a photoresist be conducted such that the ratio of the exposure amount to the portion of a photoresist to be exposed to the exposure amount to the portion of a photoresist not to be exposed is 0.1 to 30%.

Meanwhile, in the control of the developing depth of a photoresist, if necessary, only a part of the upper portion of a conductive pattern may be exposed. For this purpose, the developing depth can be controlled by increasing the ratio of the second solution of the present invention, decreasing the developing time of a photoresist or enlarging the intervals between lattices of the ultraviolet non-transmitting portion of the exposure mask. As such, when the photoresist is developed until only a part of the upper portion of a conductive pattern is exposed, uncured photoresist remains at the lower end of the conductive pattern, so a post-curing process for curing the remaining uncured photoresist is additionally required (this post-curing process may be performed after the step (f2) of FIG. 1).

Figure 2:
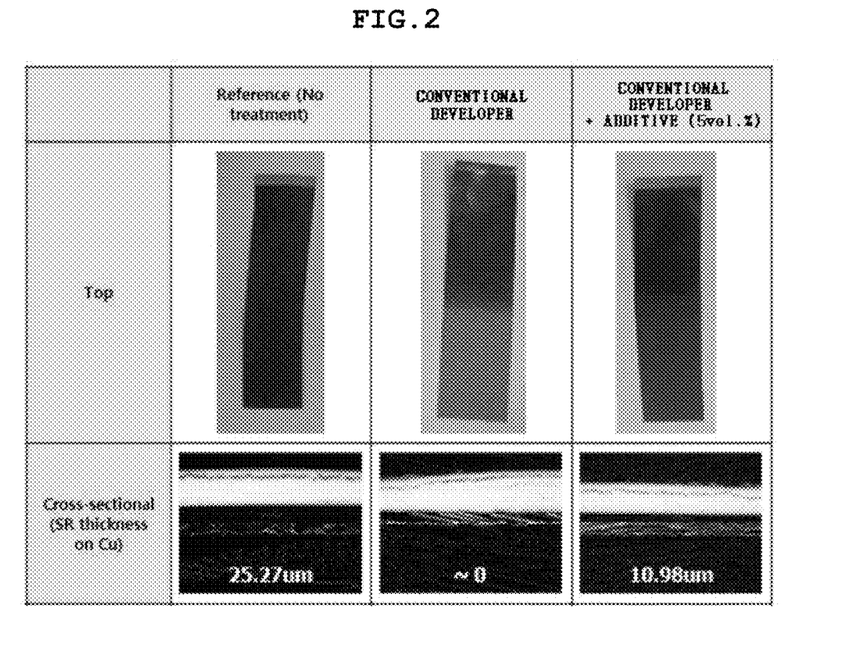
FIG. 2 shows photographs showing the effect of the composition for photoresist development according to the present invention.

FIG. 2 shows photographs obtained by developing the photoresist formed on copper foil using the developing solution according to the present invention (each sample was dipped into the developing solution).

Referring to FIG. 2, the left photograph shows the photoresist that was not treated with the developing solution. It can be ascertained from the left photograph that the photoresist remains intact (in each of the three photographs, the upper portion thereof is a portion on which copper foil is exposed with the photoresist being not applied). Meanwhile, the middle photograph shows the photoresist developed using a conventional developing solution. It can be ascertained from the middle photograph that the photoresist dipped in the developing solution was completely removed. The right photograph shows the photoresist developed using the developing solution of the present invention (this developing solution is prepared by mixing a bivalent cationic solution with the conventional developing solution in an amount of 5 vol %). It can be ascertained from the right photograph that the degree of development of the photoresist was controlled. Meanwhile, the lower photographs of FIG. 2 are scanning electron microscope (SEM) photographs showing the developing depth of a photoresist. From the upper photographs, it can be ascertained that the initial thickness of the photoresist was 25.27 μm, that the photoresist was completely removed when it was treated with the conventional developing solution, and that the thickness of the photoresist was 10.98 μm when it was treated with the developing solution of the present invention. Particularly, observing the lower right photograph, it can be ascertained that the developed surface of the photoresist is comparatively flat.

Figure 3:
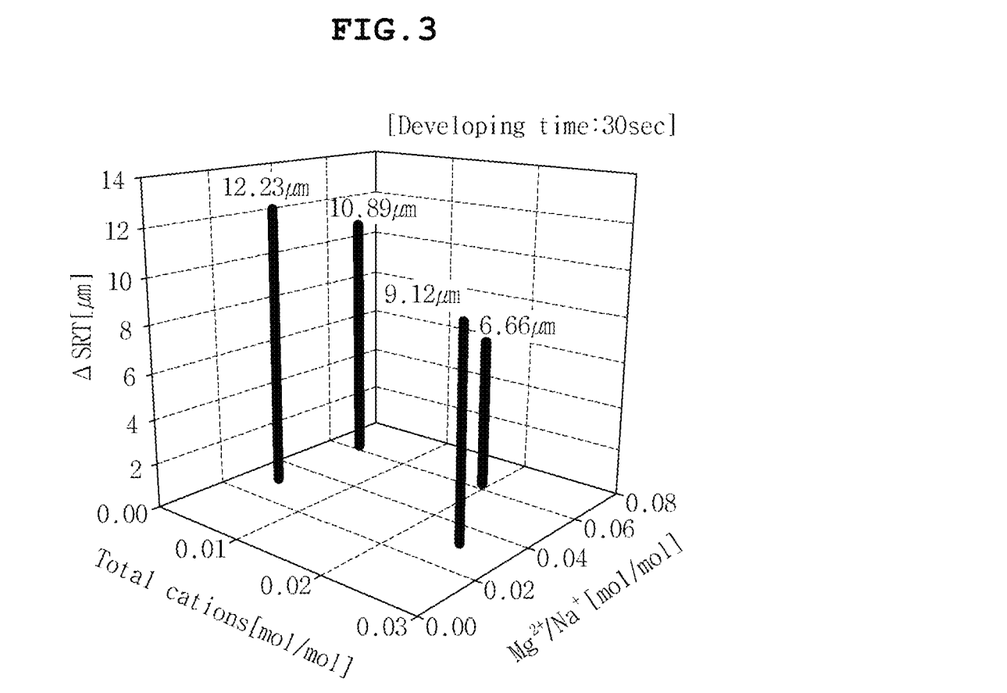
FIG. 3 is a graph showing the developing depths of a photoresist depending on the concentration and ratio of cations.

FIG. 3 is a graph showing the result of measuring the developing depths of a photoresist according to the amount and ratio of cationic components while maintaining developing time at 30 seconds.

In FIG. 3, the dependent variable Δ SRT is a developing depth, and the independent variables include an amount of total cations (monovalent and bivalent cations) and a molar ration of bivalent cation to monovalent cation. Referring to FIG. 3, as the amount of total cations increases, the developing depth decreases. It is determined that this result was influenced by the increase of the bivalent cation. Meanwhile, it can be ascertained that as the molar ratio of bivalent cation ($Mg^{2+}$) to monovalent cation ($Na^+$) increases, the developing depth decreases. The reason for this is that the amount of $Mg^{2+}$ increases, and thus water-insoluble (R—COO)$_2$Mg is formed in large quantity compared to water-soluble R—COONa.

Figure 4:
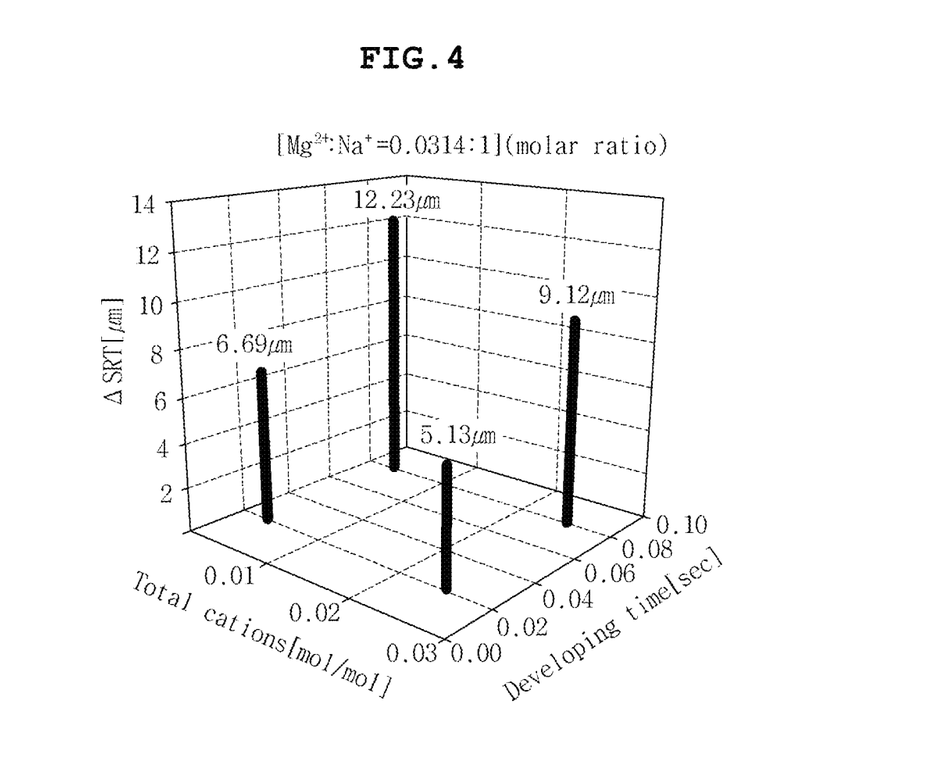
FIG. 4 is a graph showing the developing depths of a photoresist depending on cation concentration and developing time.

FIG. 4 is a graph showing the result of measuring the developing depths of a photoresist according to the developing time and the amount of total cations while maintaining the molar ratio of bivalent cation to monovalent cation ($Mg^{2+}$:$Na^+$=0.0314:1). Referring to FIG. 4, as the amount of total cations increases, the developing depth (Δ SRT) decreases, which is the same as the result of FIG. 3. Meanwhile, as developing time increases, the developing depth increases. The reason for this is determined that a larger amount of reactants are introduced with the passage of time according to the characteristics of diffusion.

Figure 5:
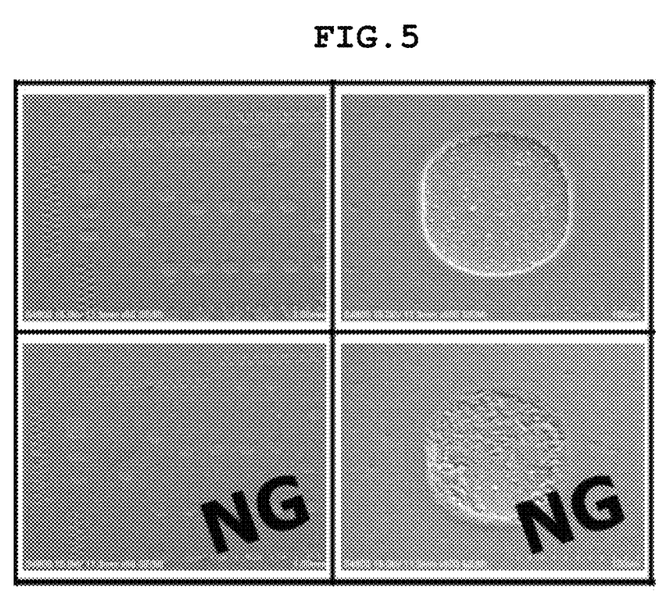
FIG. 5 shows photographs showing the degree of development of a photoresist depending on the content of magnesium in the composition according to the present invention.

FIG. 5 shows photographs showing the result that the development of a photoresist is excessively inhibited when the ratio of bivalent cation to monovalent cation is excessively high.

In FIG. 5, the left upper photograph shows the photoresist developed by a mixed solution in which a bivalent cation-containing solution is mixed with a monovalent cation-containing solution at a ratio of 10 vol %, and the right upper photograph is an enlarged photograph thereof. Referring to the enlarged view of FIG. 5, it can be ascertained that a flat developed surface was formed. In FIG. 5, the left lower photograph shows the photoresist developed by a mixed solution in which a bivalent cation-containing solution is mixed with a monovalent cation-containing solution at a ratio of 100 vol %. From the left lower photograph of FIG. 5, it can be ascertained that a bivalent cationic component was excessively added, and thus a water-insoluble component such as (R—COO)$_2$Mg or the like was excessively formed, so the photoresist was not developed, and thus traces somewhat remain.

Figure 6:
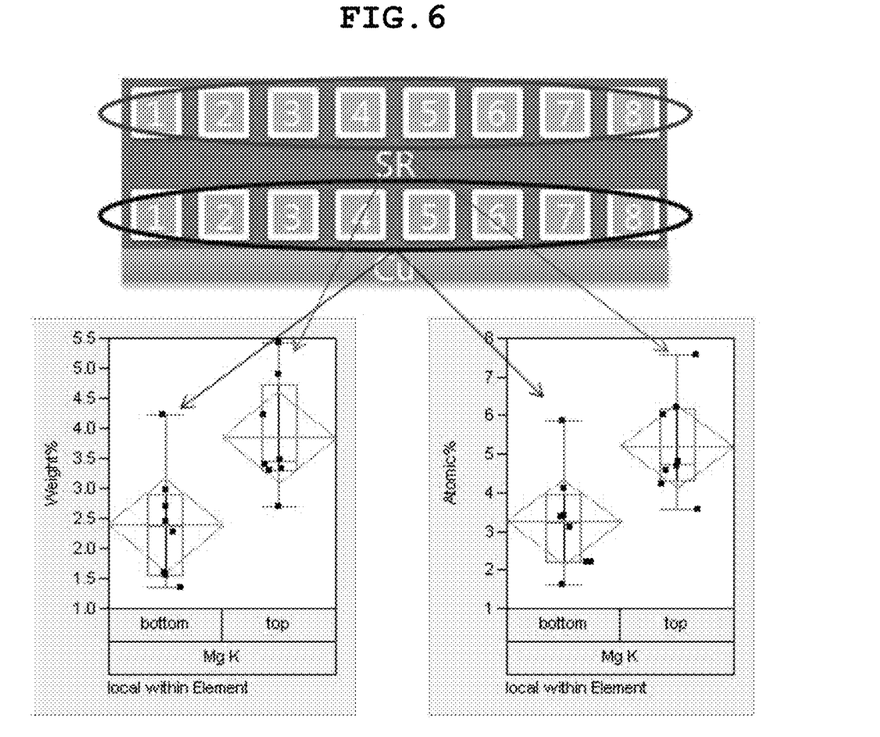
FIG. 6 shows graphs showing the concentrations of magnesium measured depending on the depth of a photoresist.

FIG. 6 is a graph showing the EDX measurement result directly evaluating the fact that bivalent cations were diffused in a photoresist layer.

The upper view of FIG. 6 shows the photoresist applied on a copper layer (indicated by "Cu"). Eight sites of the upper portion of the photoresist (indicated by "SR") and eight sites of the lower portion of the photoresist were respectively measured. The lower left of FIG. 6 indicates the weight (%) of bivalent cation (Mg$^{2+}$), and the lower right of FIG. 6 indicates atomic weight (%). Referring to the lower left right graphs of FIG. 6, it can be ascertained that the ratio of bivalent cation (Mg$^{2+}$) is comparatively low at the bottom of the photoresist, and the ratio of bivalent cation (Mg$^{2+}$) is comparatively high at the top of the photoresist. These results are direct evidence data showing the fact that the bivalent cation (Mg$^{2+}$) introduced into the top of the photoresist was moved to the bottom of the photoresist by diffusion.

Hereinafter, the present invention will be described in more detail with reference to the following Example. However, the scope of the present invention is not limited thereto.

Example 1

In order to prepare an additive, MgCO$_3$.xH$_2$O, 35 to 37 wt % of HCl, and H$_2$O (distilled water) were provided. First, 3 mL of HCl was added to 100 mL of H$_2$O to obtain an acid solution, and then 1 g of MgCO$_3$.xH$_2$O was added to the acid solution, and thus MgCl$_2$ was prepared by the following Chemical Reaction Formula 3.

MgCO$_3$+2HCl→MgCl$_2$(aq)+H$_2$O+CO$_2$(g)   [Chemical Reaction Formula 3]

When the additive prepared in this way is added to a conventional developing chemical in an amount of 5 vol %, an improved developing chemical can be obtained. Since the improved developing chemical includes both Na component and Mg component, a reaction of converting —COOH included in a solder resist into water-soluble —COONa and a reaction of converting —COOH into water-insoluble (COO)$_2$Mg take place together during a subsequent developing process, thus reducing a developing reaction rate.

In order to make a test substrate, a copper clad laminate (CCL) was pretreated with a solder resist, coated with AUS410 (manufactured by Taiyo Ink Corporation), and exposed to ultraviolet in a light intensity of 300 mJ/cm$^2$. The made test substrate was respectively dipped into an improved developing chemical and a conventional developing chemical for 60 seconds.

As the result of analyzing the development characteristics of a solder resist in Example 1, the initial thickness of the solder resist was about 25 μm, and the initial thickness thereof was maintained when the solder resist was not developed. As the result of comparing the solder resist treated with a conventional developing chemical for 60 seconds with the solder resist treated with an improved developing chemical obtained by adding an additive to the conventional developing chemical for 60 seconds, it can be ascertained that, in the case of the conventional developing chemical, the solder resist was completely developed to be entirely removed, whereas, in the case of the improved developing chemical, the solder resist remained to a thickness of about 11 μm, and was removed to a thickness of abut 14 μm.

As described above, the method of developing a photoresist using the composition for photoresist development according to the present invention is advantageous in that this method is simple in process compared to a conventional photoresist developing method, and it is possible to adjust the developing depth of a photoresist and secure the flat developed surface of the photoresist, and thus precise photoresist bumps necessarily required for a three dimensional packaging technology can be secured.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A developer composition, comprising:
   60 to 99.99 vol % of a metal salt solution; and
   0.01 to 40 vol % of a dissolution inhibitor, wherein
   the metal salt solution is a metal salt solution containing a monovalent cation wherein the metal salt containing a monovalent cation is included in an amount of 1 to 300 g per L of pure water (H$_2$O).

2. The developer composition of claim 1, wherein the dissolution inhibitor is a metal salt solution containing a bivalent cation.

3. The developer composition of claim 2, wherein the metal salt solution containing a bivalent cation is at least one selected from the group consisting of bivalent cationic metal chloride, bivalent cationic metal chlorate, bivalent cationic metal nitride, bivalent cationic metal nitrate, bivalent cationic metal sulfide, bivalent cationic metal sulfate, bivalent cationic metal carbide, bivalent cationic metal carbonate, bivalent cationic metal hydride, and bivalent cationic metal hydroxide.

4. The developer composition of claim 2, wherein the bivalent cation is at least one selected from the group consisting of Mg$^{2+}$, Ca$^{2+}$, and Sr$^{2+}$.

5. The developer composition of claim 1, wherein each of the metal salt solution and the dissolution inhibitor is an aqueous solution.

6. The developer composition of claim 1, wherein the developer is a photoresist developer.

7. The developer composition of claim 6, wherein the photoresist has a carboxyl group (—COOH).

8. The developer composition of claim 6, wherein the photoresist is a solder resist.

9. The developer composition of claim 1, wherein the metal salt containing a monovalent cation is at least one selected from the group consisting of alkali metal silicate, alkali metal hydroxide, alkali metal phosphate, and alkali metal carbonate.

10. The developer composition of claim 1, further comprising an acid solution.

11. The developer composition of claim 10, wherein the acid solution is at least one selected from the group consisting of hydrochloric acid, sulfuric acid, and nitric acid.

12. A method of developing a photoresist, comprising:
forming a photoresist layer on a surface of a circuit substrate having a conductive pattern;
disposing an exposure mask having a predetermined pattern over the photoresist layer;
applying ultraviolet onto the exposure mask to cure the photoresist layer; and
removing the photoresist layer using the developer composition of claim 1 to develop the photoresist layer.

13. The method of claim 12, wherein the developing the photoresist is conducted until the conductive pattern is exposed.

14. The method of claim 12, wherein the developing the photoresist is conducted until only the upper portion of the conductive pattern is partially exposed.

15. The method of claim 14, further comprising: post-curing the photoresist layer after the developing the photoresist layer.

16. The method of claim 12, wherein, in the curing the photoresist layer, the photoresist layer is partially cured using an exposure mask having an ultraviolet transmitting portion and an ultraviolet partially-transmitting portion.

* * * * *